US011023176B2

(12) United States Patent
Tu

(10) Patent No.: US 11,023,176 B2
(45) Date of Patent: Jun. 1, 2021

(54) STORAGE INTERFACE, TIMING CONTROL METHOD, AND STORAGE SYSTEM

(71) Applicant: Huawei Technologies Co., Ltd., Shenzhen (CN)

(72) Inventor: Jun Tu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 2 days.

(21) Appl. No.: 16/605,135

(22) PCT Filed: Apr. 28, 2017

(86) PCT No.: PCT/CN2017/082353
§ 371 (c)(1),
(2) Date: Oct. 14, 2019

(87) PCT Pub. No.: WO2018/188127
PCT Pub. Date: Oct. 18, 2018

(65) Prior Publication Data
US 2020/0159459 A1 May 21, 2020

(30) Foreign Application Priority Data
Apr. 14, 2017 (CN) .......................... 201710245609.9

(51) Int. Cl.
*G06F 3/06* (2006.01)
*G06F 1/08* (2006.01)
(Continued)

(52) U.S. Cl.
CPC .............. *G06F 3/0659* (2013.01); *G06F 1/08* (2013.01); *G06F 1/10* (2013.01); *G06F 3/0611* (2013.01);
(Continued)

(58) Field of Classification Search
CPC . G06F 1/08; G06F 1/10; G06F 3/0611; G06F 3/0658; G06F 3/0659; G06F 3/0679; G06F 7/0814
See application file for complete search history.

(56) References Cited

U.S. PATENT DOCUMENTS 8,095,717 B1 * 1/2012 White .................. G06F 3/0656
710/306
2006/0170472 A1 8/2006 Suda et al.
(Continued)

FOREIGN PATENT DOCUMENTS

CN 1380775 A 11/2002
CN 1883116 A 12/2006
(Continued)

OTHER PUBLICATIONS

Machine Translation and Abstract of Chinese Publication No. CN1380775, Nov. 20, 2002, 7 pages.
(Continued)

*Primary Examiner* — Eric T Oberly
(74) *Attorney, Agent, or Firm* — Conley Rose, P.C.

(57) ABSTRACT

The storage interface includes a first programmable input/output unit configured to perform phase inversion on a clock signal that is output by the master controller, and output the phase-inverted clock signal to the storage device. The storage interface includes a second programmable input/output unit configured to delay a data signal that is output by the master controller, and output the delayed data signal to the storage device, where the delayed data signal is delayed by a time $\Delta T$ relative to the clock signal that is output by the master controller, and $T_{CLK}/2 - \Delta T \geq T_{ISU}$ and $\Delta T \geq T_{IH}$, where $T_{CLK}$ represents a period of the clock signal, $T_{ISU}$ represents a shortest input setup time required by the storage device in each of different data rate modes, and $T_{IH}$ represents a
(Continued)

shortest input hold time employed by the storage device in each of different data rate modes.

20 Claims, 6 Drawing Sheets

(51) Int. Cl.
*G06F 1/10* (2006.01)
*H03L 7/081* (2006.01)

(52) U.S. Cl.
CPC .......... *G06F 3/0658* (2013.01); *G06F 3/0679* (2013.01); *H03L 7/0814* (2013.01)

(56) References Cited

U.S. PATENT DOCUMENTS

| | | |
|---|---|---|
| 2009/0096906 A1 | 4/2009 | Senda et al. |
| 2009/0108878 A1 | 4/2009 | Yamada |
| 2009/0146711 A1 | 6/2009 | Senda et al. |
| 2009/0154256 A1 | 6/2009 | Kim et al. |
| 2010/0257324 A1 | 10/2010 | Osawa et al. |
| 2014/0043889 A1 | 2/2014 | Ji et al. |
| 2014/0082398 A1 | 3/2014 | Lee et al. |
| 2014/0167820 A1 | 6/2014 | Kashiwakura |
| 2014/0317339 A1* | 10/2014 | Hsu ...................... G06F 3/0658 711/103 |
| 2015/0332781 A1* | 11/2015 | Lee .......................... G11C 7/10 365/185.18 |
| 2018/0189211 A1* | 7/2018 | Zehavi ................. G11C 29/028 |

FOREIGN PATENT DOCUMENTS

| | | |
|---|---|---|
| CN | 101414825 A | 4/2009 |
| CN | 101425115 A | 5/2009 |
| CN | 101453211 A | 6/2009 |
| CN | 102171761 A | 8/2011 |
| CN | 103828236 A | 5/2014 |

OTHER PUBLICATIONS

Foreign Communication From a Counterpart Application, PCT Application No. PCT/CN2017/082353, English Translation of International Search Report dated Jan. 15, 2018, 2 pages.
Foreign Communication From a Counterpart Application, PCT Application No. PCT/CN2017/082353, English Translation of Written Opinion dated Jan. 15, 2018, 3 pages.

* cited by examiner

STORAGE INTERFACE, TIMING CONTROL METHOD, AND STORAGE SYSTEM

CROSS-REFERENCE TO RELATED APPLICATIONS

This application is a U.S. National Stage of International Patent Application No. PCT/CN2017/082353 filed on Apr. 28, 2017, which claims priority to Chinese Patent Application No. 201710245609.9 filed on Apr. 14, 2017. Both of the aforementioned applications are hereby incorporated by reference in their entireties.

TECHNICAL FIELD

This application relates to the field of storage technologies, and in particular, to a storage interface, a timing control method, and a storage system.

BACKGROUND

An embedded multimedia card (Embedded Multi Media Card, eMMC) is an embedded memory standard specification formulated by the MMC Association mainly for products such as mobile phones or tablet computers. Currently, the highest rate mode supported by the eMMC 4.51 protocol is HS200, and the highest rate mode supported by the eMMC 5.0 is HS400. HS200 has an interface frequency of 200 MHz, is a single data rate mode, and has a bandwidth of 200 MB/s. HS400 also has an interface frequency of 200 MHz, is a dual data rate mode, and has a bandwidth of 400 MB/s.

The eMMC 5.0 protocol stipulates that an eMMC chip cannot directly work in HS400 mode. A master controller (Host) needs to first negotiate with an eMMC chip for working in HS200 interface mode, and then configure a corresponding register of the eMMC chip to switch to an HS400 interface mode. In other words, an eMMC storage interface in the eMMC 5.0 version on a master controller side needs to support dynamic switching between the two working modes, namely, HS200 and HS400.

FIG. 1 is a diagram of comparison between timing of an HS200 interface and an HS400 interface. As shown in FIG. 1, a phase of a clock signal HS200_CLK that is output by the HS200 interface is different from a phase of a clock signal HS400_CLK that is output by the HS400 interface. The clock signal HS200_CLK and the clock signal HS400_CLK respectively correspond to middle positions in a data signal HS200_DATA and a data signal HS400_DATA, to satisfy data sampling stability. Specifically, referring to a clock signal (CLK) inside the master controller, the phase of HS200_CLK is shifted backward by 180°, and the phase of HS400_CLK is shifted backward by 90°.

In the prior art, to support the dynamic switching between the two working modes, namely, HS200 and HS400, an eMMC storage interface shown in FIG. 2 is provided. As shown in FIG. 2, the existing eMMC storage interface generates three clock signals, namely, tx_clk, tx_clk_90, and tx_clk_180, by using an internal phase lock loop (Phase Lock Loop, PLL). tx_clk is a clock that is output by the master controller and that is used to sample a data signal, tx_clk_90 is a clock signal that is output by the master controller to an eMMC device when the eMMC storage interface is in HS400 working mode, and tx_clk_180 is a clock signal that is output by the master controller to the eMMC device when the eMMC storage interface is in HS200 working mode. A phase of tx_clk_90 is shifted backward by 90° relative to that of tx_clk, and a phase of tx_clk_180 is shifted backward by 180° relative to that of tx_clk. A clock selection module CLK_MUX is used for selection of a clock signal that is output by the eMMC storage interface. When the eMMC storage interface is in HS200 working mode, the clock selection module CLK_MUX selects tx_clk_180 as the clock signal that is output by the eMMC storage interface. When the eMMC storage interface is in HS400 working mode, the clock selection module CLK_MUX selects tx_clk_90 as the clock signal that is output by the eMMC storage interface.

The existing eMMC storage interface shown in FIG. 2 can dynamically switch between the two working modes, namely, HS200 and HS400, by switching the output clock signal. However, the existing eMMC storage interface shown in FIG. 2 has the following disadvantages:

(1) To satisfy requirements on an input data setup time (Input Setup Time) and an input data hold time (Input Hold Time) that are stipulated by the eMCC protocol, the existing eMMC storage interface has a very high delay requirement on a data output clock path. Because the interface frequencies in HS200 and HS400 can maximally reach 200 MHz, a difference between a delay of the clock signal tx_clk to an input/output unit IOE 1 and a delay of the clock signal tx_clk_90 (or the tx_clk_180) to an input/output unit IOE 2 needs to be controlled within approximately 1 nanosecond. For the eMMC storage interface implemented by using a programmable logic array (Field Programmable Gate Array, FPGA), a signal delay inside the eMMC storage interface is formed by accumulating segment delays of massive programmable logical units and path units. It is very difficult to precisely control the accumulated delays on a nanosecond level.

(2) For a design in which a plurality of eMMC storage interfaces need to be implemented by using a single FPGA chip, the FPGA chip is integrated on a large scale, that is, a plurality of groups of circuit structures shown in FIG. 2 are integrated. It may be understood that each phase lock loop PLL inside the FPGA chip has a different distance and a different delay to a corresponding input/output unit, and each clock selection module CLK_MUX inside the FPGA chip also has a different distance and a different delay to a corresponding input/output unit. Consequently, it is more difficult to control signal delays in all the plurality of eMMC storage interfaces on a nanosecond level.

(3) When a design of an FPGA implementing the eMMC storage interface is modified, wiring between programmable logical units may be different. It is also very difficult to control all signal delays in FPGAs having different wiring designs on a nanosecond level.

(4) If a same load file is applied to different batches of FPGA devices or a same FPGA device runs in different temperature or voltage environments, a delay parameter of the eMMC storage interface varies. It is very difficult to control all signal delays in the FPGA in these different cases on a nanosecond level.

It can be learned from the foregoing that it is very difficult to control a delay on the eMMC storage interface provided in the prior art.

SUMMARY

This application provides a storage interface, a timing control method, and a storage system, to delay a data signal that is output by a master controller to a storage device and perform phase inversion processing on a clock signal that is output by the master controller to the storage device, thereby simply and effectively satisfying requirements on an input data setup time and an input data hold time when the storage interface in different data rate modes outputs data.

According to a first aspect, this application provides a storage interface, connected between a master controller and a storage device, and including a first programmable input/output unit and a second programmable input/output unit, where the first programmable input/output unit is configured to perform phase inversion on a clock signal that is output by the master controller, and output the phase-inverted clock signal to the storage device, to sample a data signal that is output by the master controller to the storage device; and the second programmable input/output unit is configured to delay the data signal that is output by the master controller, and output the delayed data signal to the storage device, where the delayed data signal is delayed by a time $\Delta T$ in timing relative to the clock signal that is output by the master controller, and $T_{CLK}/2-\Delta T \geq T_{ISU}$ and $\Delta T \geq T_{IH}$, where $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

With reference to the first aspect, in some embodiments, the storage device may include a storage medium and a device controller, where the device controller may be configured to perform a write operation on the storage medium based on the clock signal and the delayed data signal that are output by the storage interface.

With reference to the first aspect, in some embodiments, the storage interface is integrated in the master controller, or the storage interface is independent of the master controller.

With reference to the first aspect, in some embodiments, a plurality of data rate modes corresponding to the storage device may include a single data rate mode and a dual data rate mode. In the two data rate modes, the clock signal and the data signal that are output by the storage interface satisfy: $T_{CLK}/2-\Delta T \geq T_{ISU-SDR}$ and $\Delta T \geq T_{IH-SDR}$, and $T_{CLK}/2-\Delta T \geq T_{ISU-DDR}$ and $\Delta T \geq T_{IH-DDR}$. $T_{ISU-SDR}$ and $T_{ISU-DDR}$ respectively represent a shortest input setup time required by the storage device in each of single data rate mode and dual data rate mode, and $T_{IH-HS200}$ and $T_{IH-HS400}$ respectively represent a shortest input hold time required by the storage device in each of single data rate mode and dual data rate mode. In this way, the storage interface can support dynamic switching of the storage device between the single data rate mode and the dual data rate mode.

It may be understood that when the master controller writes data to the storage device, the data signal that is output by the master controller is delayed, and phase shift processing is performed on the clock signal that is output by the master controller, so that requirements on the shortest input setup time and the shortest input hold time can be both satisfied when the storage device samples the delayed data signal based on the phase-shifted clock signal in different data rate modes. That is, the storage interface can support dynamic switching of the storage device between a plurality of data rate modes.

With reference to the first aspect, in some embodiments, the first programmable input/output unit and the second programmable input/output unit may be two independent programmable logic devices, or may be integrated in a same programmable logic device.

With reference to the first aspect, in some embodiments, to support a plurality of storage devices, the storage interface may include a plurality of groups that are of the first programmable input/output units and the second programmable input/output units and that respectively correspond to the plurality of storage devices, where one storage device corresponds to one group of the first programmable input/output unit and the second programmable input/output unit. The plurality of storage devices support different data rate modes.

With reference to the first aspect, in some embodiments, the storage device may be an embedded multimedia card eMCC, and the plurality of data rate modes corresponding to the data signal include HS200 and HS400, where $T_{CLK}/2-\Delta T \geq T_{ISU-HS200}$ and $\Delta T \geq T_{IH-HS200}$, and $T_{CLK}/2-\Delta T \geq T_{ISU-HS400}$ and $\Delta T \geq T_{IH-HS400}$, $T_{ISU-HS200}$ and $T_{ISU-HS400}$ respectively represent a shortest input setup time required by the eMMC in each of the two data rate modes HS200 and HS400, and $T_{IH-HS200}$ and $T_{IH-HS400}$ respectively represent a shortest input hold time required by the eMMC in each of the two data rate modes HS200 and HS400.

In HS200 mode, an input setup time $t_{ISU}$ before a rising edge of the phase-inverted clock signal tx_clk is equal to $T_{CLK}/2-\Delta T$, and an input hold time $t_{IH}$ after the rising edge of the phase-inverted clock signal tx_clk is equal to $T_{CLK}/2+\Delta T$. Herein, a frequency of the storage interface of the eMMC is 200 MHz, and $T_{CLK}=5$ ns. Therefore, the shortest input hold time required by the eMMC in HS200 mode is inevitably satisfied, provided that $t_{ISU}=T_{CLK}/2-\Delta T \geq 1.4$ ns is satisfied.

In HS400 mode, an input setup time $t_{ISU}$ before the rising edge of the phase-inverted clock signal tx_clk is equal to $T_{CLK}/2-\Delta T$, and an input hold time $t_{IH}$ after the rising edge of the phase-inverted clock signal tx_clk is equal to $\Delta T$. Similarly, an input setup time $t_{ISU}$ before a falling edge of the phase-inverted clock signal tx_clk is equal to $T_{CLK}/2-\Delta T$, and an input hold time $t_{IH}$ after the falling edge of the phase-inverted clock signal tx_clk is equal to $\Delta T$. In HS400 mode, $t_{ISU}=T_{CLK}/2-\Delta T \geq 0.4$ ns and $t_{IH}=\Delta T \geq 0.4$ ns need to be satisfied.

It can be calculated that the shortest input setup time and the shortest input hold time that are required in each of the two rate modes, namely, HS200 and HS400 can be satisfied, provided that $T_{CLK}/2-\Delta T \geq 1.4$ ns and $\Delta T \geq 0.4$ ns. That is, for the eMMC, the storage interface performs phase inversion on the clock signal that is output by the master controller, and delays the data signal that is output by the master controller by $\Delta T$ ($\Delta T \in [0.4$ ns, $1.1$ ns]), so that the storage interface can support the dynamic switching of the eMMC between the two rate modes, namely, HS200 and HS400.

It may be understood that when the master controller writes data to the eMMC, the storage interface delays the data signal that is output by the master controller, and performs phase inversion processing on the clock signal that is output by the master controller, to support switching of the eMMC between different data rate modes. There is no need to respectively generate two clock signals whose phases are different for the two data rate modes, namely, HS200 and HS400 or strictly control a delay difference between the two clock signals whose phases are different, so that implementation is very easy. In addition, a delay difference between different batches of programmable logic devices or a delay difference of a programmable logic device between different temperatures and voltages has small impact on sending timing of the storage interface.

According to a second aspect, this application provides a storage system. The storage system may include: a master controller, a storage device, and a storage interface connected between the master controller and the storage device, where the storage interface includes a first programmable input/output unit and a second programmable input/output unit, where the first programmable input/output unit is configured to perform phase inversion on a clock signal that is output by the master controller, and output the phase-inverted clock signal to the storage device, to sample a data signal that is output by the master controller to the storage device; and the second programmable input/output unit is configured to delay the data signal that is output by the master controller, and output the delayed data signal to the storage device, where the delayed data signal is delayed by a time $\Delta T$ in timing relative to the clock signal that is output by the master controller, and $T_{CLK}/2-\Delta T \geq T_{ISU}$ and $\Delta T \geq T_{IH}$, where $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

Specifically, the storage interface may be the storage interface according to the first aspect and any possible embodiment of the first aspect. For details, refer to the first aspect, and details are not described herein again.

According to a third aspect, this application provides a timing control method. The timing control method may include: performing, by a terminal by using a first programmable input/output unit, phase inversion on a clock signal that is output by a master controller to a storage device; and delaying, by the terminal by using a second programmable input/output unit, a data signal that is output by the master controller to the storage device by a time $\Delta T$. Herein, the clock signal may be used to sample the data signal, $T_{CLK}/2-\Delta T \geq T_{ISU}$ and $\Delta T \geq T_{IH}$, $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

In this application, the terminal may include the first programmable input/output unit and the second programmable input/output unit. Specifically, the terminal may provide a storage interface for the storage device, and the storage interface may include the first programmable input/output unit and the second programmable input/output unit. The storage device may be integrated in the terminal and used as an internal storage of the terminal. Alternatively, the storage device may be independent of the terminal and used as an external storage of the terminal. For specific implementation of the storage interface, refer to the first aspect, and details are not described herein again.

It may be understood that when the terminal writes data to the storage device, the data signal that is output by the terminal is delayed, and phase shift processing is performed on the clock signal that is output by the terminal, so that requirements on the shortest input setup time and the shortest input hold time can be both satisfied when the storage device samples the delayed data signal based on the phase-shifted clock signal in different data rate modes. That is, the terminal can support dynamic switching of the storage device between a plurality of data rate modes.

With reference to the third aspect, in some embodiments, a plurality of data rate modes corresponding to the storage device may include a single data rate mode and a dual data rate mode. In the two data rate modes, the clock signal and the data signal that are output by the storage interface 10 satisfy: $T_{CLK}/2-\Delta T \geq T_{ISU-SDR}$ and $\Delta T \geq T_{IH-SDR}$, and $T_{CLK}/2-\Delta T \geq T_{ISU-DDR}$ and $\Delta T \geq T_{IH-DDR}$. $T_{ISU-SDR}$ and $T_{ISU-DDR}$ respectively represent a shortest input setup time required by the storage device in each of single data rate mode and dual data rate mode, and $T_{IH-HS}200$ and $T_{IH-HS400}$ respectively represent a shortest input hold time required by the storage device in each of single data rate mode and dual data rate mode. In this way, the storage interface 10 can support dynamic switching of the storage device between the single data rate mode and the dual data rate mode.

With reference to the third aspect, in some embodiments, the storage device may be an embedded multimedia card eMCC. The eMCC may work in single data rate mode HS200 or dual data rate mode HS400. In single data rate mode, the eMCC performs a read/write operation on the data signal only at a rising edge of the clock signal. In dual data rate mode, the eMCC respectively performs a write operation and a read operation once at the rising edge and a falling edge of the clock signal.

Specifically, the phase-inverted clock signal and the delayed data signal that are output to the eMMC may satisfy: $T_{CLK}/2-\Delta T \geq T_{ISU-HS200}$ and $\Delta T \geq T_{IH-HS200}$, and $T_{CLK}/2-\Delta T \geq T_{ISU-HS400}$ and $\Delta T \geq T_{IH-HS400}$. $T_{ISU-HS200}$ and $T_{ISU-HS400}$ respectively represent a shortest input setup time required by the eMMC in each of the two data rate modes, namely, HS200 and HS400, and $T_{IH-HS200}$ and $T_{IH-HS400}$ respectively represent a shortest input hold time required by the eMMC in each of the two data rate modes, namely, HS200 and HS400. In this way, the storage interface 10 can support dynamic switching of the eMMC between the two data rate modes, namely, HS200 and HS400.

It can be calculated that, for the eMMC, phase inversion is performed on the clock signal that is output by the master controller, and the data signal that is output by the master controller is delayed by $\Delta T$ ($\Delta T \in [0.4$ ns, $1.1$ ns$]$), so that the dynamic switching of the eMMC between the two rate modes, namely, HS200 and HS400 can be supported. For a specific calculation process, refer to the content in an embodiment shown in FIG. 5, and details are not described herein.

According to a fourth aspect, this application provides a terminal, including functional units configured to perform the method according to the third aspect.

According to a fifth aspect, this application provides a terminal, including a processor and an internal memory. The internal memory includes: a master controller, a storage device, and a storage interface connected between the master controller and the storage device. The storage interface may include a first programmable input/output unit and a second programmable input/output unit. The first programmable input/output unit may be configured to perform phase inversion on a clock signal that is output by the master controller, and output the phase-inverted clock signal to the storage device, to sample a data signal that is output by the master controller to the storage device. The second programmable input/output unit may be configured to delay the data signal that is output by the master controller, and output the delayed data signal to the storage device, where the delayed data signal is delayed by a time $\Delta T$ in timing relative to the clock signal that is output by the master controller, and $T_{CLK}/2-\Delta T \geq T_{ISU}$ and $\Delta T \geq T_{IH}$. Herein, $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

Specifically, the storage interface may be the storage interface according to the first aspect and any possible embodiment of the first aspect. For details, refer to the first aspect, and details are not described herein again.

According to a sixth aspect, a computer-readable storage medium is provided. The readable storage medium stores program code for implementing the timing control method according to the third aspect and any possible embodiment of the third aspect. The program code includes an executable instruction for running the timing control method according to the third aspect and any possible embodiment of the third aspect.

BRIEF DESCRIPTION OF DRAWINGS

To describe the technical solutions in the embodiments of the present invention more clearly, the following briefly describes the accompanying drawings required for describing the embodiments.

DESCRIPTION OF EMBODIMENTS

Terms used in implementations of this application are merely intended to explain specific embodiments of this application rather than limit this application.

Figure 1:
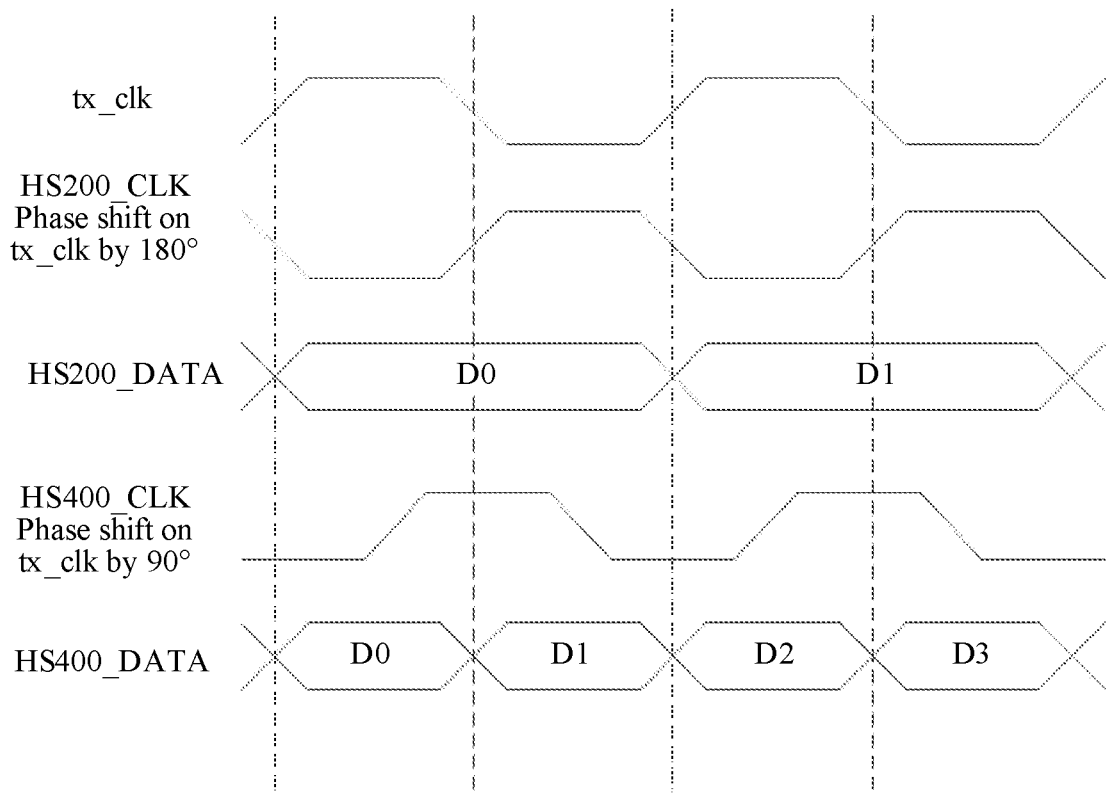
FIG. 1 is a diagram of comparison between timing of an HS200 interface and an HS400 interface in the prior art.
Figure 2:
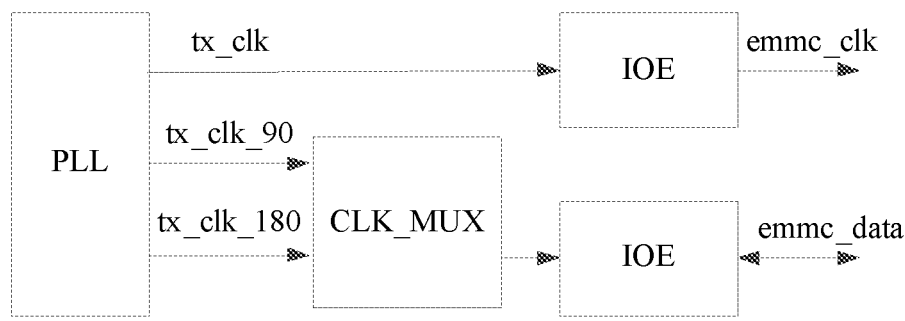
FIG. 2 is a schematic structural diagram of an eMMC storage interface in the prior art.
Figure 3:
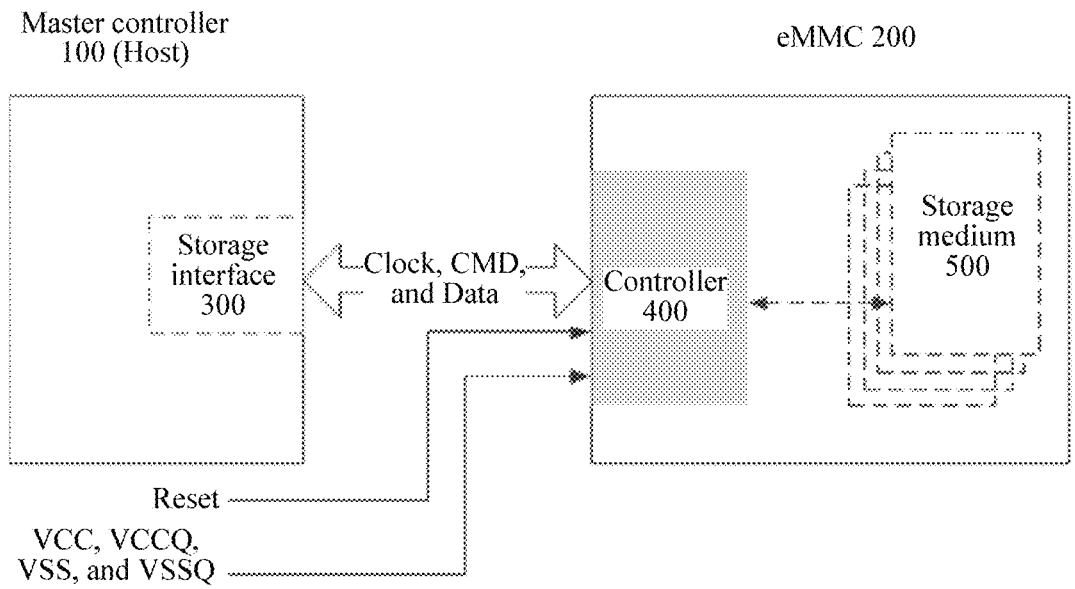
FIG. 3 is a schematic structural diagram of an eMMC storage system in this application.

FIG. 3 shows an eMMC storage system in this application. As shown in FIG. 3, the eMMC storage system may include a master controller 100 and an eMMC 200, and the master controller 100 controls the eMMC 200 by using a storage interface 300.

The eMMC 200 integrates an internal controller 400 and a storage medium 500. The internal controller 400 can be used for error checking and correction (Error Checking and Correction, ECC), bad block management (Bad Block Management, BBM), wear leveling (Wear Leveling), and the like. The storage medium 500 may be an erasable programmable storage medium, for example, a NAND flash. The eMMC 200 further implements an eMMC interface. The master controller 100 only needs to deliver a command to the eMMC 200 by using an interface bus without configuration of any function, such as ECC, BMM, and wear leveling, in memory management.

Specifically, the interface bus between the master controller 100 and the eMMC 200 may include: a clock cable CLK, a command and response transmission line CMD, and a two-way data line Data. In each clock period on the clock cable CLK, a one-bit command or response signal may be transmitted on the command and response transmission line CMD, or one-bit data (in single data rate mode) or two-bit data (in dual data rate mode) may be transmitted on the two-way data line Data.

Figure 4A:
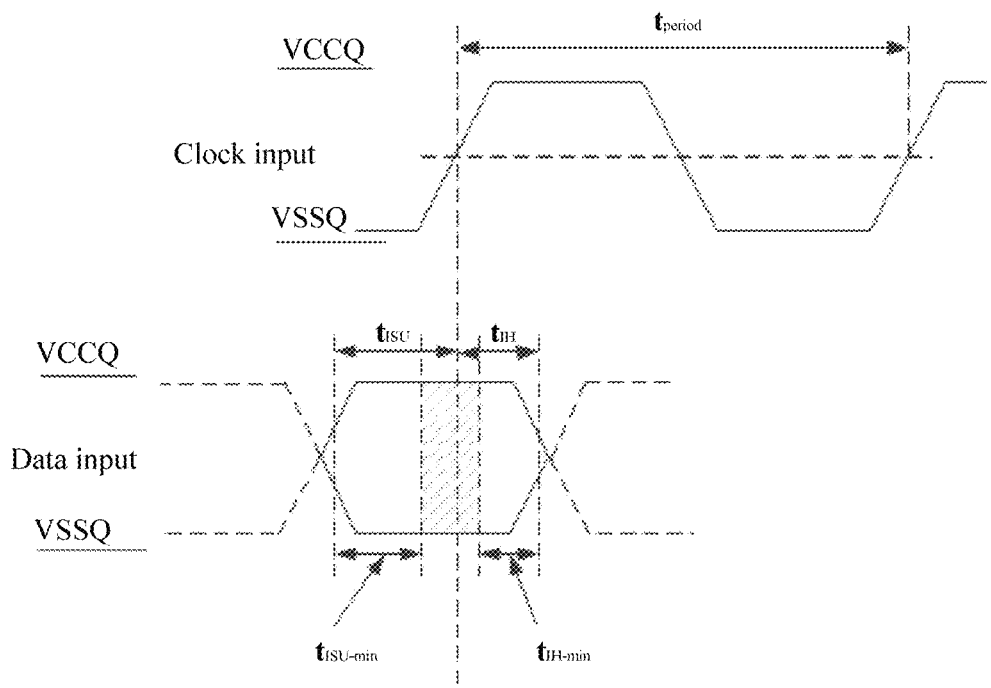
FIG. 4A is a schematic diagram of timing when an eMMC works in data rate mode HS200.
Figure 4B:
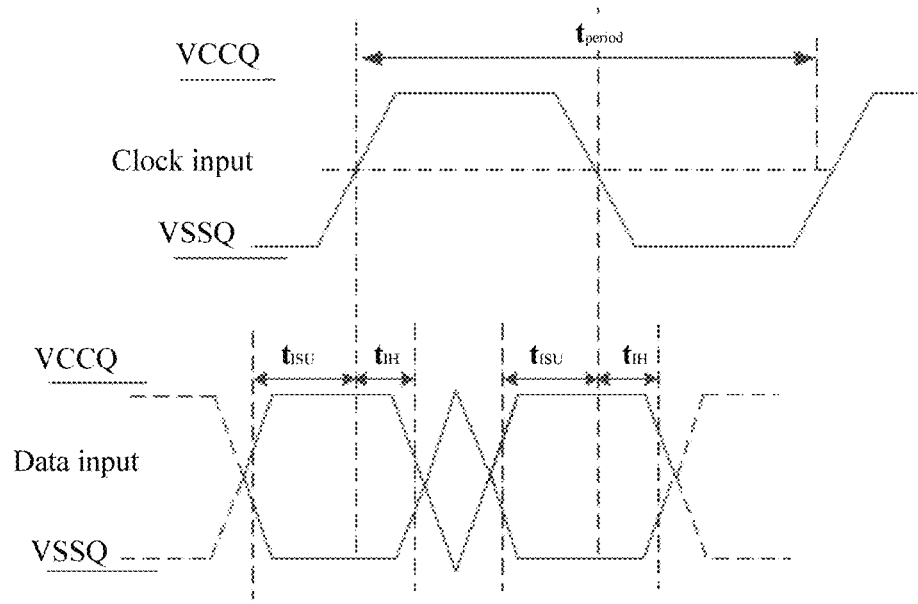
FIG. 4B is a schematic diagram of timing when an eMMC works in data rate mode HS400.

An eMMC protocol supports a plurality of data rate modes. FIG. 4A and FIG. 4B respectively show input timing of an eMMC in two data rate modes, namely, HS200 and HS400.

FIG. 4A shows timing when the eMMC works in data rate mode HS200. As shown in FIG. 4A, HS200 is a single data rate mode, and an eMMC chip performs a read/write operation once only at a rising edge of a clock signal, that is, sampling is performed once in HS200 in one clock period. A bandwidth in HS200 can maximally reach 200 MB/s. To ensure that data near a sampling point is stable, a steady-state time before and after the sampling point in HS200 mode is stipulated in the eMMC protocol as follows:

$t_{ISU} \geq 1.4$ ns, and $t_{IH} \geq 0.8$ ns.

$t_{ISU}$ represents an input setup time, and $t_{IH}$ represents an input hold time. The input setup time is a time in which input data needs to remain stable before a rising edge of a clock arrives. The input hold time is a time in which the input data needs to remain stable after the rising edge of the clock arrives. It can be learned from the foregoing that a shortest input setup time in HS200 mode is 1.4 ns, and a shortest input hold time is 0.8 ns.

FIG. 4B shows timing when the eMMC works in data rate mode HS400. As shown in FIG. 4B, HS400 is a dual data rate mode, and an eMMC chip respectively performs a read operation and a write operation once at a rising edge and a falling edge of a clock signal, that is, sampling is performed twice in HS400 in one clock period. A bandwidth in HS400 can maximally reach 400 MB/s. To ensure that data near a sampling point is stable, a steady-state time before and after the sampling point in HS400 mode is stipulated in the eMMC protocol as follows:

$t_{ISU} \geq 0.4$ ns, and $t_{IH} \geq 0.4$ ns.

$t_{ISU}$ represents an input setup time, and $t_{IH}$ represents an input hold time. It can be learned from the foregoing that a shortest input setup time and a shortest input hold time in HS400 mode are both 0.4 ns.

The eMMC protocol stipulates that the eMMC cannot directly work in HS400 mode. Therefore, the master controller 100 needs to first negotiate with the eMMC 200 for working in data rate mode HS200, and then configure a corresponding register of the eMMC 200 to switch to the data rate mode HS400.

It may be understood that if a clock signal and a data signal that are output by the master controller 100 by using the storage interface 300 can satisfy both the shortest input setup time and the shortest input hold time in HS200 mode and the shortest input setup time and the shortest input hold time in HS400 mode in timing, the master controller 100 can control the eMMC chip 200 to switch between the two data rate modes, namely, HS200 and HS400.

In this application, the storage interface 300 may be integrated in the master controller 100, or may be independent of the master controller 100. This is not limited.

This application provides a storage interface. The storage interface is connected between a master controller and a storage device, to simply and effectively achieve an objective that data signals output by the storage interface to the storage device in different data rate modes all satisfy requirements on an input data setup time and an input data hold time that are stipulated in a protocol.

A main inventive principle of this application may include:

For the storage device working in different data rate modes, the storage interface delays a data signal that is output by the master controller to the storage device, and performs phase shift processing on a clock signal that is output by the master controller to the storage device, so that a rising edge/a falling edge of the phase-shifted clock signal corresponds to a middle position in the delayed data signal in timing, to satisfy requirements on a shortest input setup time and a shortest input hold time in the different data rate modes.

It may be understood that the rising edge/the falling edge of the clock signal may be used to sample output data. If the rising edge/the falling edge of the clock signal corresponds to the middle position in the output data signal, it can be ensured that output data before and after a sampling time point is stable, that is, the shortest input setup time and the shortest input hold time that are required by the storage device are satisfied.

For example, in data rate mode HS200 of the eMMC, referring to FIG. 4A, the middle position may be a position indicated by a rectangular shadow region in the figure, that is, a sampling time point corresponding to the data signal may fluctuate within a range, provided that the following conditions are satisfied: $t_{ISU} \geq t_{ISU\text{-}min}$, and $t_{IH} \geq t_{IH\text{-}min}$. $t_{ISU\text{-}min}$ represents the shortest input setup time (in HS200 mode, $t_{IH\text{-}min}$=0.8 ns), and $t_{IH\text{-}min}$ represents the shortest input hold time. Specifically, the protocol stipulates that (in HS200 mode, $t_{ISU\text{-}min}$=1.4 ns).

It should be noted that the eMMC storage system shown in FIG. 3 only shows a storage system to which this application is applicable, and this application is also applicable to another storage system needing to switch between a plurality of data transmission rates.

Figure 5:
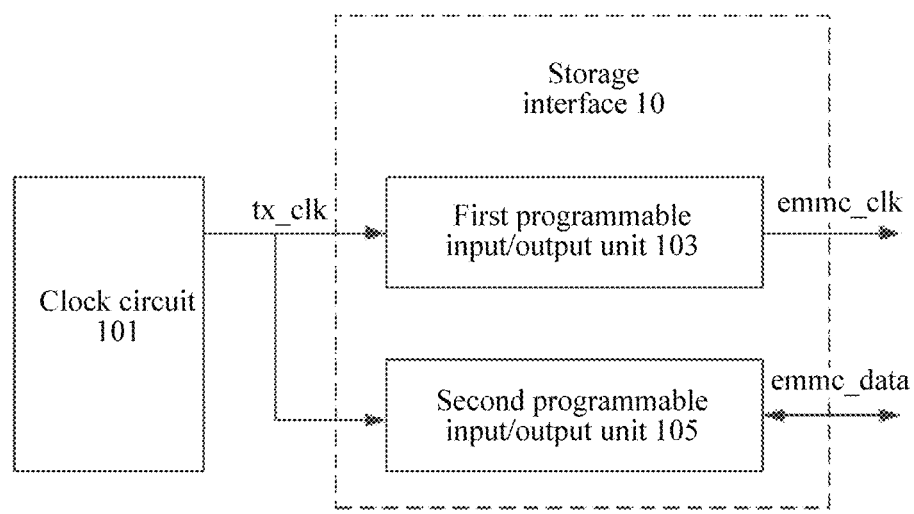
FIG. 5 is a schematic structural diagram of a storage interface according to an embodiment of this application.

FIG. 5 is a schematic structural diagram of a storage interface according to an embodiment of this application. A storage interface 10 is connected between a master controller and a storage device, and the storage interface 10 may be integrated in the master controller, or may be independent of the master controller. In this application, the storage device may work in a plurality of data rate modes. As shown in FIG. 5, the storage interface 10 may include a first programmable input/output unit 103 and a second programmable input/output unit 105.

The first programmable input/output unit 103 may be configured to perform phase inversion on a clock signal (tx_clk) that is output by the master controller, and output the phase-inverted clock signal to the storage device, to sample a data signal that is output by the master controller to the storage device. A period of the phase-inverted clock signal may be represented by $T_{CLK}$.

Specifically, the first programmable input/output unit 103 is connected to a clock circuit 101 in the master controller. The clock circuit 101 may be configured to generate the clock signal. During specific implementation, the clock circuit 101 may be a phase lock loop PLL circuit, or may be a clock circuit of another type. This is not limited herein.

The second programmable input/output unit 105 may be configured to delay the data signal that is output by the master controller, and output the delayed data signal to the storage device. The delayed data signal is delayed by a time $\Delta T$ in timing relative to the clock signal that is output by the master controller, $T_{CLK}/2 - \Delta T \geq T_{ISU}$, and $\Delta T \geq T_{IH}$. $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

In this application, the storage device may include a storage medium and a device controller. The device controller may be configured to perform a write operation on the storage medium based on the clock signal and the delayed data signal that are output by the storage interface 10.

In some embodiments, the plurality of data rate modes corresponding to the storage device may include a single data rate mode and a dual data rate mode. In the two data rate modes, the clock signal and the data signal that are output by the storage interface 10 satisfy: $T_{CLK}/2 - \Delta T \geq T_{ISU\text{-}SDR}$ and $\Delta T \geq T_{IH\text{-}SDR}$, and $T_{CLK}/2 - \Delta T \geq T_{ISU\text{-}DDR}$ and $\Delta T \geq T_{IH\text{-}DDR}$. $T_{ISU\text{-}SDR}$ and $T_{ISU\text{-}DDR}$ respectively represent shortest input setup times required by the storage device in single data rate mode and dual data rate mode, and $T_{IH\text{-}HS200}$ and $T_{IH\text{-}HS400}$ respectively represent a shortest input hold time required by the storage device in each of single data rate mode and dual data rate mode. In this way, the storage interface 10 can support dynamic switching of the storage device between the single data rate mode and the dual data rate mode.

It should be understood that if the storage device works in single data rate mode, that is, samples the data signal only at a rising edge/a falling edge of the clock signal, a clock period $T_{Data}$ of the data signal that is output by the master controller to the storage device is consistent with $T_{CLK}$. If the storage device works in dual data rate mode, that is, samples the data signal at both a rising edge and a falling edge of the clock signal, a clock period $T_{Data}$ of the data signal that is output by the master controller to the storage device is ½ of $T_{CLK}$.

It may be understood that when the master controller writes data to the storage device, the data signal that is output by the master controller is delayed, and phase shift processing is performed on the clock signal that is output by the master controller, so that requirements on the shortest input setup time and the shortest input hold time can be both satisfied when the storage device samples the delayed data signal based on the phase-shifted clock signal in different data rate modes. That is, the storage interface 10 can support dynamic switching of the storage device between a plurality of data rate modes.

The technical solution provided in this application is described in detail below by using an example in which the storage device is an embedded multimedia card eMCC.

It should be understood that the eMCC may work in single data rate mode HS200 or dual data rate mode HS400. In single data rate mode, the eMCC performs a read/write operation on the data signal only at a rising edge of a clock signal. In dual data rate mode, the eMCC respectively performs a write operation and a read operation once at the rising edge and a falling edge of the clock signal.

Specifically, a clock signal and a data signal that are output by the storage interface 10 to the eMMC may satisfy: $T_{CLK}/2 - \Delta T \geq T_{ISU\text{-}HS200}$ and $\Delta T \geq T_{IH\text{-}HS200}$, and $T_{CLK}/2 - \Delta T \geq T_{ISU\text{-}HS400}$ and $\Delta T \geq T_{IH\text{-}HS400}$. $T_{ISU\text{-}HS200}$ and $T_{ISU\text{-}HS400}$ respectively represent a shortest input setup time required by the eMMC in each of the two data rate modes, namely, HS200 and HS400, and $T_{IH\text{-}HS200}$ and $T_{IH\text{-}HS400}$ respectively represent a shortest input hold time required by the eMMC in each of the two data rate modes, namely, HS200 and HS400. In this way, the storage interface 10 can support dynamic switching of the eMMC between the two data rate modes, namely, HS200 and HS400.

Figure 6:
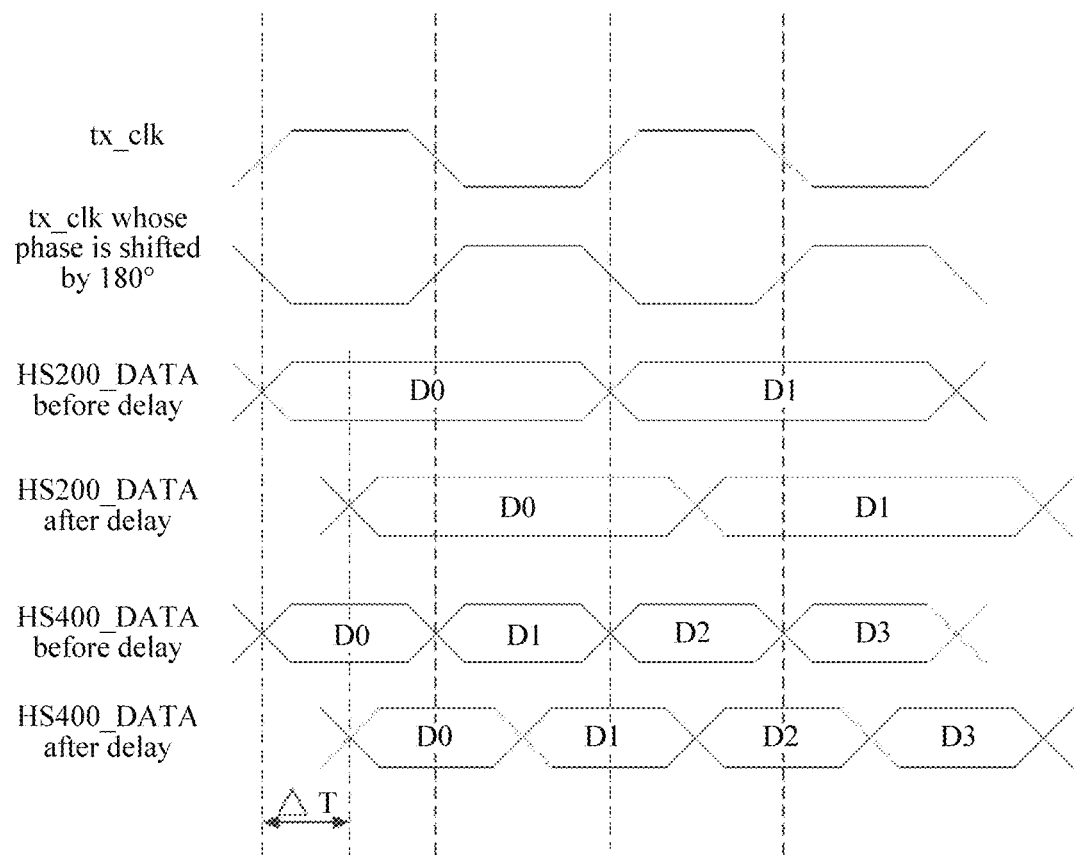
FIG. 6 is a schematic diagram of timing when a storage interface performs phase inversion processing on a clock signal and delays a data signal in two rate modes, namely, HS200 and HS400, according to this application.

As shown in FIG. 6, tx_clk represents the clock signal that is output by the storage interface 10 to the eMMC. A period of a data signal HS200_DATA that is output by the storage interface 10 in rate mode HS200 is consistent with a period of tx_clk, and a period of a data signal HS400_DATA that is output by the storage interface 10 in rate mode HS400 is ½ of that of tx_clk. The storage interface 10 performs phase inversion on the clock signal tx_clk, and delays the data signal by ΔT.

It can be learned in FIG. 6 that in rate mode HS200, a rising edge of the clock signal tx_clk before phase shift processing does not correspond to a middle position in the data signal HS200_DATA, and does not satisfy the shortest input setup time and the shortest input hold time that are required by the eMMC in HS200. Therefore, data sampling cannot be performed. In rate mode HS400, neither the rising edge nor a falling edge of the clock signal tx_clk before phase shift processing corresponds to a middle position in the data signal HS400_DATA, and does not satisfy the shortest input setup time and the shortest input hold time that are required by the eMMC in HS400. Therefore, data sampling cannot be performed.

It can be learned in FIG. 6 that in rate mode HS200, the rising edge of tx_clk after phase inversion corresponds to the middle position in the data signal HS200_DATA, satisfies the shortest input setup time and the shortest input hold time that are required by the eMMC in HS200, and may be used for data sampling. In rate mode HS400, the rising edge and the falling edge of tx_clk after phase inversion both correspond to the middle position in the data signal HS400_DATA, satisfy the shortest input setup time and the shortest input hold time that are required by the eMMC in HS400, and may be used for data sampling.

It may be understood that a steady-state time before and after a sampling point in HS200 mode is stipulated in the eMMC protocol as follows: $t_{ISU} \geq 1.4$ ns and $t_{IH} \geq 0.8$ ns, and a steady-state time before and after a sampling point in HS400 mode is stipulated in the eMMC protocol as follows: $t_{ISU} \geq 0.4$ ns and $t_{IH} \geq 0.4$ ns.

It can be learned in FIG. 6 that in HS200 mode, an input setup time $t_{ISU}$ before the rising edge of the phase-inverted clock signal tx_clk is equal to $T_{CLK}/2-\Delta T$, and an input hold time $t_{IH}$ after the rising edge of the phase-inverted clock signal tx_clk is equal to $T_{CLK}/2+\Delta T$. Herein, a frequency of the storage interface 10 of the eMMC is 200 MHz, and $T_{CLK}=5$ ns. Therefore, the shortest input hold time required by the eMMC in HS200 mode is inevitably satisfied, provided that $t_{ISU}=T_{CLK}/2-\Delta T \geq 1.4$ ns is satisfied.

It can be learned in FIG. 6 that in HS400 mode, an input setup time $t_{ISU}$ before the rising edge of the phase-inverted clock signal tx_clk is equal to $T_{CLK}/2-\Delta T$, and an input hold time $t_{IH}$ after the rising edge of the phase-inverted clock signal tx_clk is equal to ΔT. Similarly, an input setup time $t_{ISU}$ before the falling edge of the phase-inverted clock signal tx_clk is equal to $T_{CLK}/2-\Delta T$, and an input hold time $t_{IH}$ after the falling edge of the phase-inverted clock signal tx_clk is equal to ΔT. In HS400 mode, $t_{ISU}=T_{CLK}/2-\Delta T \geq 0.4$ ns and $t_{IH}=\Delta T \geq 0.4$ ns need to be satisfied.

It can be calculated that the shortest input setup time and the shortest input hold time that are required in each of the two rate modes, namely, HS200 and HS400 can be satisfied, provided that $T_{CLK}/2-\Delta T \geq 1.4$ ns and $\Delta T \geq 0.4$ ns. That is, for the eMMC, the storage interface 10 performs phase inversion on the clock signal that is output by the master controller, and delays the data signal that is output by the master controller by ΔT (ΔT∈[0.4 ns, 1.1 ns]), so that the storage interface 10 can support the dynamic switching of the eMMC between the two rate modes, namely, HS200 and HS400.

In an actual application, a programmable logic device whose delay parameter satisfies a delay requirement that ΔT∈[0.4 ns, 1.1 ns] may be selected as the second programmable input/output unit 105.

It may be understood that when the master controller writes data to the eMMC, the storage interface 10 delays the data signal that is output by the master controller, and performs phase inversion processing on the clock signal that is output by the master controller, to support switching of the eMMC between different data rate modes. There is no need to respectively generate two clock signals whose phases are different for the two data rate modes, namely, HS200 and HS400 or strictly control a delay difference between the two clock signals whose phases are different, so that implementation is very easy. In addition, a delay difference between different batches of programmable logic devices or a delay difference of a programmable logic device between different temperatures and voltages has small impact on sending timing of the storage interface.

It may be understood that the first programmable input/output unit 103 and the second programmable input/output unit 105 are both implemented by programmable logic devices, and the storage interface 10 can delay, to different degrees, the data signal that is output by the master controller. Therefore, the storage interface 10 provided in this application can be applied to different storage devices. The different storage devices may have different data rate modes between which dynamic switching is performed.

In some optional embodiments, the first programmable input/output unit 103 and the second programmable input/output unit 105 may be two independent programmable logic devices, or may be integrated in a same programmable logic device.

Figure 7:
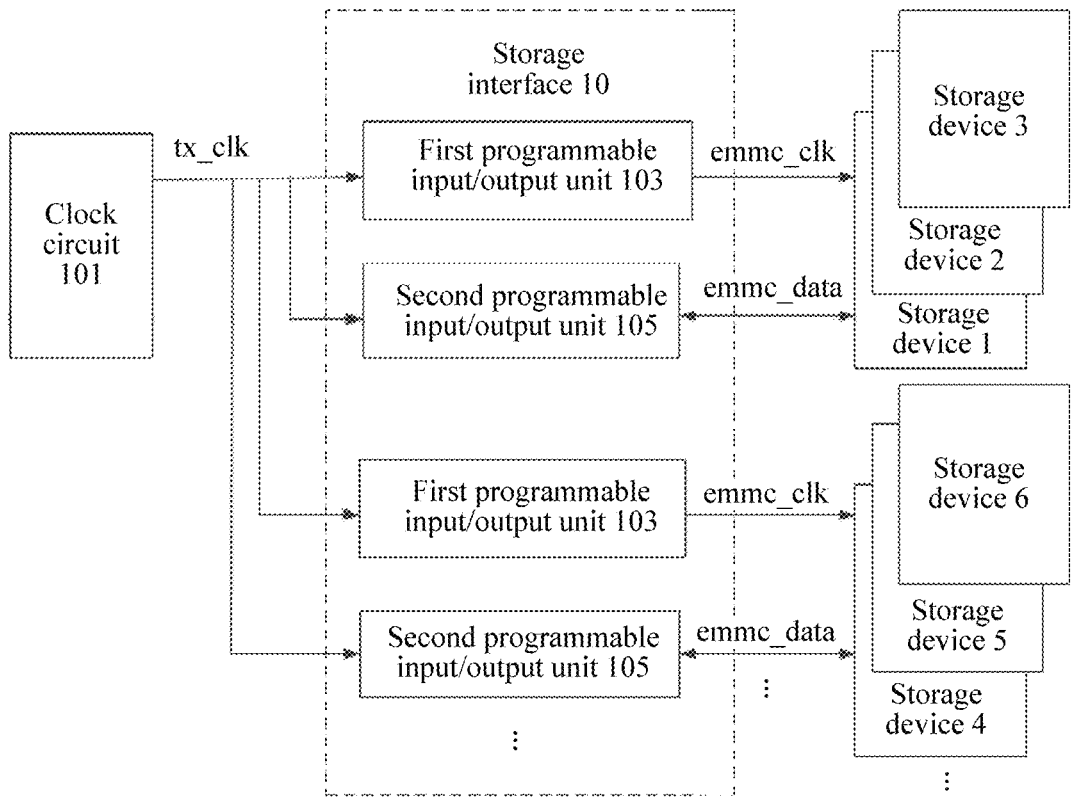
FIG. 7 is a schematic structural diagram of a storage interface according to another embodiment of this application.

In some optional embodiments, as shown in FIG. 7, to support a plurality of storage devices, the storage interface 10 may include a plurality of groups that are of the first programmable input/output unit 103 and the second programmable input/output unit 105 and that respectively correspond to the plurality of storage devices. Each group corresponds to one storage device. The plurality of storage devices support different data rate modes. For example, storage devices 1 to 3 support a same data rate mode, and also have a same shortest input setup time and shortest input hold time required in different rate modes. Storage devices 4 to 6 support a same data rate mode, and also have a same shortest input setup time and shortest input hold time required in different rate modes. However, the storage devices 1 to 3 support a different data rate mode from that of the storage devices 4 to 6. That is, the storage devices 1 to 3 are one storage device, and the storage devices 4 to 6 are another storage device. The one storage device supports a different data rate mode from that supported by the another storage device, and the storage interface 10 needs to perform different delay processing on the data signal that is output by the master controller. It should be noted that FIG. 7 is merely intended to explain this embodiment of the present invention rather than constitute a limitation.

Optionally, to support a plurality of storage devices, a plurality of the storage interfaces 10 shown in FIG. 5 may alternatively be used to connect to the master controller, and one storage interface 10 corresponds to one storage device.

Based on the storage interface 10 described in the embodiment in FIG. 5, this application further provides a timing control method for a storage interface. A programmable input/output unit performs phase inversion on a clock signal that is output by a master controller, delays a data signal that is output by the master controller, and then outputs the phase-inverted clock signal and the delayed data signal to a storage device, to support dynamic switching of the storage device between different data rate modes. Descriptions are provided below:

S101: A terminal performs, by using a first programmable input/output unit, phase inversion on the clock signal that is output by the master controller to the storage device.

S103: The terminal delays, by using a second programmable input/output unit, the data signal that is output by the master controller to the storage device by a time $\Delta T$.

Herein, the clock signal may be used to sample the data signal. $T_{CLK}/2-\Delta T \geq T_{ISU}$ and $\Delta T \geq T_{IH}$, $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

In this application, the terminal may include the first programmable input/output unit and the second programmable input/output unit. Specifically, the terminal may provide the storage interface for the storage device, and the storage interface may include the first programmable input/output unit and the second programmable input/output unit. The storage device may be integrated in the terminal and used as an internal storage of the terminal. Alternatively, the storage device may be independent of the terminal and used as an external storage of the terminal. For specific implementation of the storage interface, refer to the foregoing embodiment, and details are not described herein again.

In some embodiments, a plurality of data rate modes corresponding to the storage device may include a single data rate mode and a dual data rate mode. In the two data rate modes, the clock signal and the data signal that are output by the storage interface 10 satisfy: $T_{CLK}/2-\Delta T \geq T_{ISU-SDR}$ and $\Delta T \geq T_{IH-SDR}$, and $T_{CLK}/2-\Delta T \geq T_{ISU-DDR}$ and $\Delta T \geq T_{IH-DDR}$. $T_{ISU-SDR}$ and $T_{ISU-DDR}$ respectively represent a shortest input setup time required by the storage device in each of single data rate mode and dual data rate mode, and $T_{IH-HS200}$ and $T_{IH-HS400}$ respectively represent a shortest input hold time required by the storage device in each of single data rate mode and dual data rate mode. In this way, the storage interface 10 can support dynamic switching of the storage device between the single data rate mode and the dual data rate mode.

In some embodiments, the storage device may be an embedded multimedia card eMCC. The eMCC may work in single data rate mode HS200 or dual data rate mode HS400. In single data rate mode, the eMCC performs a read/write operation on the data signal only at a rising edge of the clock signal. In dual data rate mode, the eMCC respectively performs a write operation and a read operation once at the rising edge and a falling edge of the clock signal.

Specifically, the phase-inverted clock signal and the delayed data signal that are output to the eMMC may satisfy: $T_{CLK}/2-\Delta T \geq T_{ISU-HS200}$ and $\Delta T \geq T_{IH-HS200}$, and $T_{CLK}/2-\Delta T \geq T_{ISU-HS400}$ and $\Delta T \geq T_{IH-HS400}$. $T_{ISU-HS200}$ and $T_{ISU-HS400}$ respectively represent a shortest input setup time required by the eMMC in each of the two data rate modes, namely, HS200 and HS400, and $T_{IH-HS200}$ and $T_{IH-HS400}$ respectively represent a shortest input hold time required by the eMMC in each of the two data rate modes, namely, HS200 and HS400. In this way, the storage interface 10 can support dynamic switching of the eMMC between the two data rate modes, namely, HS200 and HS400.

It can be calculated that, for the eMMC, phase inversion is performed on the clock signal that is output by the master controller, and the data signal that is output by the master controller is delayed by $\Delta T$ ($\Delta T \in [0.4$ ns, $1.1$ ns$]$), so that the dynamic switching of the eMMC between the two rate modes, namely, HS200 and HS400 can be supported. For a specific calculation process, refer to the content in the embodiment in FIG. 5, and details are not described herein again.

It may be understood that when the terminal writes data to the storage device, the data signal that is output by the terminal is delayed, and phase shift processing is performed on the clock signal that is output by the terminal, so that requirements on the shortest input setup time and the shortest input hold time can be both satisfied when the storage device samples the delayed data signal based on the phase-shifted clock signal in different data rate modes. That is, the terminal can support dynamic switching of the storage device between a plurality of data rate modes.

To facilitate implementation of the technical solution provided in this application, this application further provides a terminal. The terminal may be configured to implement the timing control method described in the embodiment in FIG. 8. As shown in FIG. 9, a terminal 90 may include a first timing control unit and a second timing control unit.

The first timing control unit may be configured to perform, by using a first programmable input/output unit, phase inversion on a clock signal that is output by a master controller to a storage device.

The second timing control unit may be configured to delay, by using a second programmable input/output unit, a data signal that is output by the master controller to the storage device by a time $\Delta T$.

Herein, the clock signal may be used to sample the data signal. $T_{CLK}/2-\Delta T \geq T_{ISU}$ and $\Delta T \geq T_{IH}$, $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

In this application, the terminal may include the first programmable input/output unit and the second programmable input/output unit. Specifically, the terminal may provide a storage interface for the storage device, and the storage interface may include the first programmable input/output unit and the second programmable input/output unit. The storage device may be integrated in the terminal and used as an internal storage of the terminal. Alternatively, the storage device may be independent of the terminal and used as an external storage of the terminal. For specific implementation of the storage interface, refer to the foregoing embodiment, and details are not described herein again.

Figure 8:
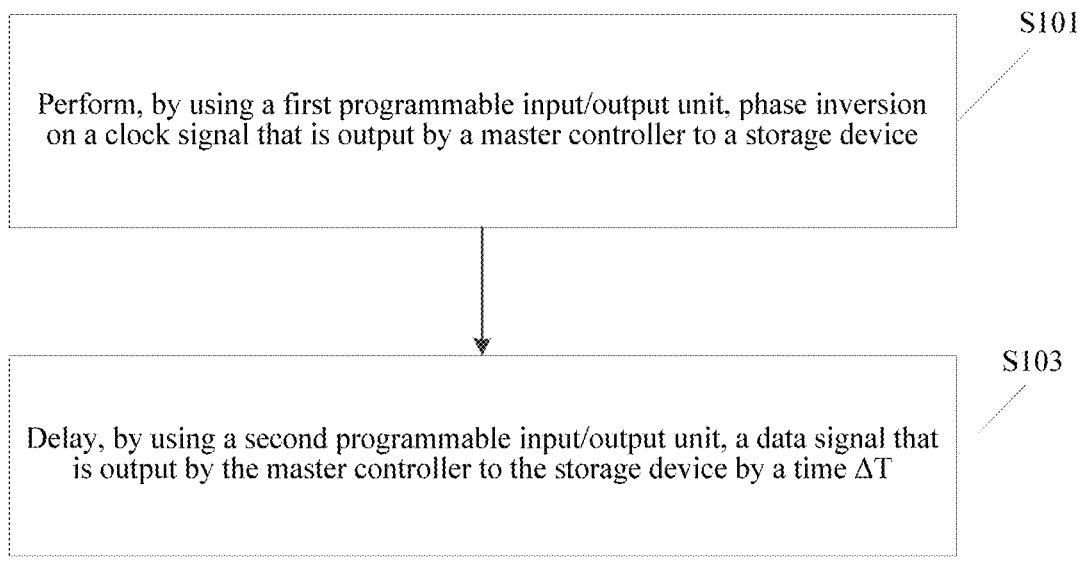
FIG. 8 is a schematic flowchart of a timing control method according to an embodiment of this application.
Figure 9:
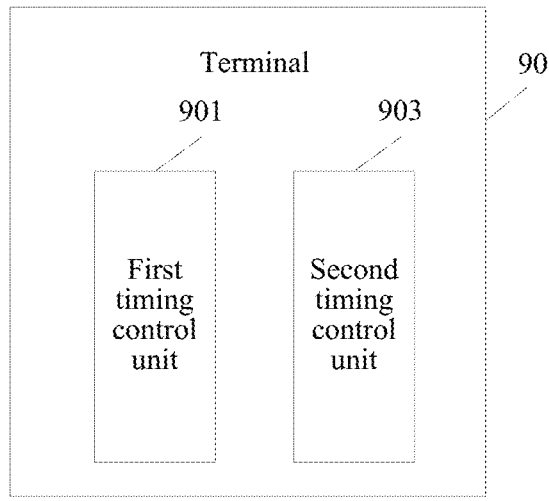
FIG. 9 is a schematic structural diagram of a terminal according to an embodiment of this application.

It may be understood that for specific implementation of the functional units included in the terminal 90, refer to the method embodiment in FIG. 8, and details are not described herein again.

To facilitate implementation of the technical solution provided in this application, this application further provides a terminal. The terminal may include the storage interface 10 described in the embodiment in FIG. 5, and may be configured to implement the timing control method described in the embodiment in FIG. 8.

Figure 10:
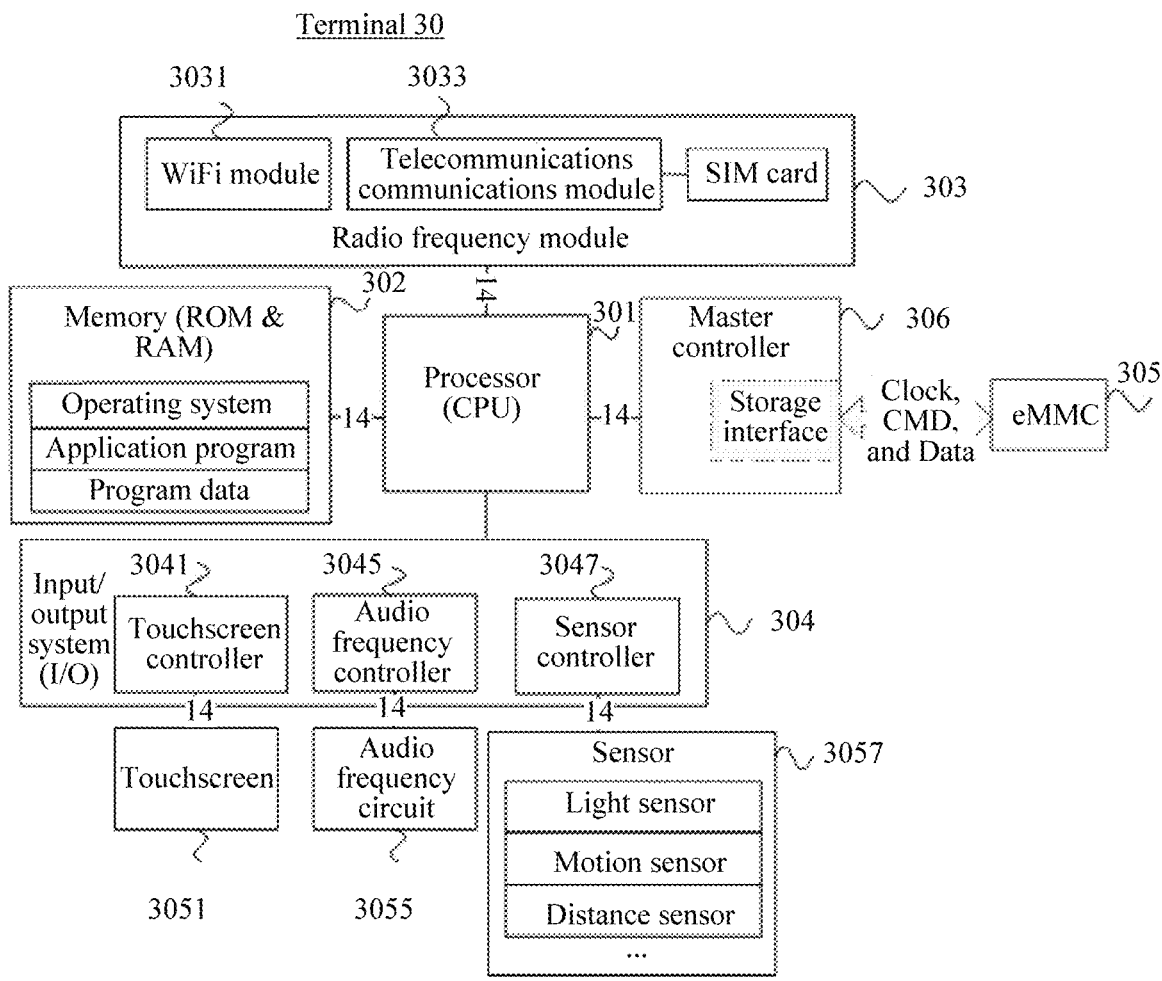
FIG. 10 is a schematic structural diagram of a terminal according to another embodiment of this application.

As shown in FIG. 10, a terminal 30 may include: a processor 301, a memory 302 coupled to the processor 301, a radio frequency module 303, an input/output system 304, and an eMMC 305. These components may communicate on one or more communications buses 14.

The radio frequency module 303 is configured to receive and send a signal, and mainly integrates a receiver and a transmitter of the terminal 30. During specific implementation, the radio frequency module 303 may include, but is not limited to, a WiFi module 3031 and a telecommunications radio frequency module 3033. The WiFi module 3031 may be configured to access the Internet. The telecommunications radio frequency module 3033 may be a GSM (2G) module, a WCDMA (3G) module, or an LTE (4G) module, and may be configured to establish a call connection to another device through a telecommunications operator network, or may be configured to access the Internet through the telecommunications operator network. It should be noted that, not limited to the modules shown in FIG. 10, the radio frequency module 303 may further include a Bluetooth module and the like. In some embodiments, the radio frequency module 303 may be implemented on a separate chip.

The input/output system 304 is mainly configured to implement a function of interaction between the terminal 30 and a user/external environment, and mainly includes an input/output apparatus of the terminal 30. During specific implementation, the input/output system 304 may include a touchscreen controller 3041, an audio frequency controller 3045, and a sensor controller 3047. Each controller may be coupled to a corresponding peripheral device (a touchscreen 3051, an audio frequency circuit 3055, and a motion sensor 3057). It should be noted that the input/output system 304 may further include another I/O peripheral.

The eMMC 305 may be configured to extend internal storage space of the terminal 30 and store user materials such as pictures, documents, and emails of a user. The eMMC 305 may be implemented as the eMMC storage system shown in FIG. 3, and the master controller 306 may be independently configured for the eMMC 305. Optionally, the master controller 306 may alternatively be integrated in the processor 301. In this application, the eMMC 305 can support dynamic switching between a plurality of different data rate modes. For details, refer to the content in the embodiment in FIG. 5, and details are not described herein again. In some optional embodiments, the terminal 30 may further include another type of memory, for example, an SD card. This is not limited herein.

The processor 301 may integratively include: one or more CPUs, a clock module, and a power management module. The clock module is mainly configured to generate a clock required by data transmission and timing control for the processor 301. The power management module is mainly configured to provide stable and highly precious voltages for the processor 301, the radio frequency module 303, the input/output system 304, and the like.

The memory 302 is coupled to the processor 301, and is configured to store various software programs and/or a plurality of groups of instructions, running software, input and output data, and an intermediate result, exchange information with an external memory, and the like. During specific implementation, the memory 302 may include a high speed random access memory, and may further include a nonvolatile memory, for example, one or more volatile random access memories (Random Access Memory, RAM). The memory 302 may further be configured to store an operating system, for example, an embedded operating system such as Android, iOS, Windows, or Linux.

It should be noted that FIG. 10 is merely an implementation of this embodiment of the present invention. In an actual application, the terminal 30 may further include more or fewer components. This is not limited herein.

In addition, this application further provides a storage system. The storage system may include: a master controller, a storage device, and a storage interface connected between the master controller and the storage device. The storage interface includes a first programmable input/output unit and a second programmable input/output unit. The first programmable input/output unit is configured to perform phase inversion on a clock signal that is output by the master controller, and output the phase-inverted clock signal to the storage device, to sample a data signal that is output by the master controller to the storage device. The second programmable input/output unit is configured to delay the data signal that is output by the master controller, and output the delayed data signal to the storage device, where the delayed data signal is delayed by a time ΔT in timing relative to the clock signal that is output by the master controller, and $T_{CLK}/2-\Delta T \geq T_{ISU}$ and $\Delta T \geq T_{IH}$. Herein, $T_{CLK}$ represents a period of the clock signal, $T_{ISU}$ represents a shortest input setup time required by the storage device in each of different data rate modes, and $T_{IH}$ represents a shortest input hold time required by the storage device in each of different data rate modes.

For specific implementation of the storage interface, refer to the embodiment in FIG. 5, and details are not described herein again.

In conclusion, during implementation of the embodiments of the present invention, when the master controller writes data to the storage device, the storage interface delays the data signal that is output by the master controller, and performs phase inversion processing on the clock signal that is output by the master controller, to support switching of the storage device between different data rate modes. There is no need to respectively generate clock signals for different data rate modes or strictly control a delay difference between different clock signals corresponding to different data rate modes, so that implementation is very easy. In addition, a delay difference between different batches of programmable logic devices or a delay difference of a programmable logic device between different temperatures and voltages has small impact on sending timing of the storage interface.

A person of ordinary skill in the art may understand that all or some of the processes of the methods in the embodiments may be implemented by a computer program instructing relevant hardware. The program may be stored in a computer readable storage medium. When the program runs, the processes of the methods in the embodiments are performed. The foregoing storage medium includes: any medium that can store program code, such as a ROM, a random access memory RAM, a magnetic disk, or an optical disc.

What is claimed is:

1. A method, comprising:
    outputting, by a master controller, a clock signal to a storage interface, wherein the storage interface is coupled to the master controller and a storage device, and wherein the storage interface comprises a first programmable input/output circuit and a second programmable input/output circuit;
    outputting, by the master controller, a data signal to the storage interface;
    receiving, by the first programmable input/output circuit, the clock signal from the master controller;
    performing, by the first programmable input/output circuit, a phase inversion on the clock signal to obtain a phase-inverted clock signal;
    outputting, by the first programmable input/output circuit, the phase-inverted clock signal to the storage device;

receiving, by the second programmable input/output circuit, the data signal from the master controller;

delaying, by the second programmable input/output circuit, the data signal by a time difference ($\Delta T$) relative to the clock signal to obtain a delayed data signal, wherein $T_{CLK}/2-\Delta T \geq T_{ISU}$ and $\Delta T \geq T_{IH}$, wherein $T_{CLK}$ represents a period of the phase-inverted clock signal, wherein $T_{ISU}$ represents a shortest input setup time of the storage device in each of different data rate modes, and wherein $T_{IH}$ represents a shortest input hold time of the storage device in each of the different data rate modes;

outputting, by the second programmable input/output circuit, the delayed data signal to the storage device;

receiving, by the storage device, the phase-inverted clock signal from the first programmable input/output circuit;

receiving, by the storage device, the delayed data signal from the second programmable input/output circuit; and sampling, by the storage device, the delayed data signal based on the phase-inverted clock signal.

2. The method of claim 1, wherein the storage device comprises a storage medium and a device controller, and wherein the method further comprises performing, by the device controller, a write operation on the storage medium based on the phase-inverted clock signal and the delayed data signal.

3. The method of claim 1, wherein the data signal corresponds to a plurality of data rate modes that comprise a single data rate mode and a dual data rate mode, wherein $T_{CLK}/2-\Delta T \geq T_{ISU\text{-}SDR}$ and $\Delta T \geq T_{IH\text{-}SDR}$, wherein $T_{ISU\text{-}SDR}$ represents a shortest input setup time of the storage device in the single data rate mode, wherein $T_{IH\text{-}SDR}$ represents a shortest input hold time of the storage device in the single data rate mode, wherein $T_{CLK}/2-\Delta T \geq T_{ISU\text{-}DDR}$ and $\Delta T \geq T_{IH\text{-}DDR}$, wherein $T_{ISU\text{-}DDR}$ represents a shortest input setup time of the storage device in the dual data rate mode, and wherein $T_{IH\text{-}DDR}$ represents a shortest input hold time of the storage device in the dual data rate mode.

4. The method of claim 1, wherein the first programmable input/output circuit and the second programmable input/output circuit are two independent programmable logic devices.

5. The method of claim 1, wherein the storage interface further comprises a plurality of groups of first programmable input/output circuits and second programmable input/output circuits that correspond to a plurality of storage devices in a one-to-one manner, and wherein each of the storage devices supports a different data rate mode than at least one other storage device of the storage devices.

6. The method of claim 1, wherein the storage interface is integrated in the master controller.

7. The method of claim 1, wherein the storage device is an embedded multimedia card (eMMC), wherein a plurality of data rate modes corresponding to the data signal comprises a data rate mode HS200 and a data rate mode HS400, wherein $T_{CLK}/2-\Delta T \geq T_{ISU\text{-}HS200}$ and $\Delta T \geq T_{IH\text{-}HS200}$, wherein $T_{ISU\text{-}HS200}$ represents a shortest input setup time of the eMMC in the data rate mode HS200, wherein $T_{IH\text{-}HS200}$ represents a shortest input hold time of the eMMC in the data rate mode HS200, wherein $T_{CLK}/2-\Delta T \geq T_{ISU\text{-}HS400}$ and $\Delta T \geq T_{IH\text{-}HS400}$, wherein $T_{ISU\text{-}HS400}$ represents a shortest input setup time of the eMMC in the data rate mode HS400, and wherein $T_{IH\text{-}HS400}$ represents a shortest input hold time of the eMMC in the data rate mode HS400.

8. The method of claim 1, wherein the first programmable input/output circuit and the second programmable input/output circuit are integrated in a same programmable logic device.

9. The method of claim 1, wherein the storage interface is distinct from the master controller.

10. A storage system, comprising:
a storage device;
a master controller configured to output a clock signal and a data signal; and
a storage interface coupled to the master controller and the storage device and comprising:
a first programmable input/output circuit configured to:
receive the clock signal from the master controller;
perform a phase inversion on the clock signal to obtain a phase-inverted clock signal; and
output the phase-inverted clock signal to the storage device; and
a second programmable input/output circuit configured to:
receive the data signal from the master controller;
delay the data signal by a time difference ($\Delta T$) relative to the clock signal to obtain a delayed data signal; and
output the delayed data signal to the storage device, wherein $T_{CLK}/2-\Delta T \geq T_{ISU}$ and $\Delta T \geq T_{IH}$, wherein $T_{CLK}$ represents a period of the phase-inverted clock signal, wherein $T_{ISU}$ represents a shortest input setup time of the storage device in each of different data rate modes, and wherein $T_{IH}$ represents a shortest input hold time of the storage device in each of the different data rate modes,
wherein the storage device is configured to:
receive the phase-inverted clock signal from the first programmable input/output circuit;
receive the delayed data signal from the second programmable input/output circuit; and
sample the delayed data signal based on the phase-inverted clock signal.

11. The storage system of claim 10, wherein the storage device comprises a storage medium and a device controller, and wherein the device controller is configured to perform a write operation on the storage medium based on the phase-inverted clock signal and the delayed data signal.

12. The storage system of claim 10, wherein the data signal corresponds to a plurality of data rate modes that comprise a single data rate mode and a dual data rate mode, wherein $T_{CLK}/2-\Delta T \geq T_{ISU\text{-}SDR}$ and $\Delta T \geq T_{IH\text{-}SDR}$, wherein $T_{ISU\text{-}SDR}$ represents a shortest input setup time of the storage device in the single data rate mode, wherein $T_{IH\text{-}SDR}$ represents a shortest input hold time of the storage device in the single data rate mode, wherein $T_{CLK}/2-\Delta T \geq T_{ISU\text{-}DDR}$ and $\Delta T \geq T_{IH\text{-}DDR}$, wherein $T_{ISU\text{-}DDR}$ represents a shortest input setup time of the storage device in the dual data rate mode, and wherein $T_{IH\text{-}DDR}$ represents a shortest input hold time of the storage device in the dual data rate mode.

13. The storage system of claim 10, wherein the first programmable input/output circuit and the second programmable input/output circuit are two independent programmable logic devices.

14. The storage system of claim 10, wherein the storage interface further comprises a plurality of groups of first programmable input/output circuits and second programmable input/output circuits that correspond to a plurality of storage devices in a one-to-one manner, and wherein each of the storage devices supports a different data rate mode than at least one other storage device of the storage devices.

15. The storage system of claim 10, wherein the storage interface is integrated in the master controller.

16. The storage system of claim 10, wherein the storage device is an embedded multimedia card (eMMC), wherein a plurality of data rate modes corresponding to the data signal comprises a data rate mode HS200 and a data rate mode HS400, wherein $T_{CLK}/2-\Delta T \geq T_{ISU\text{-}HS200}$ and $\Delta T \geq T_{IH\text{-}HS200}$, wherein $T_{ISU\text{-}HS200}$ represents a shortest input setup time of the eMMC in the data rate mode HS200, wherein $T_{IH\text{-}HS200}$ represents a shortest input hold time of the eMMC in the data rate mode HS200, wherein $T_{CLK}/2-\Delta T \geq T_{ISU\text{-}HS400}$ and $\Delta T \geq T_{IH\text{-}HS400}$, wherein $T_{ISU\text{-}HS400}$ represents a shortest input setup time of the eMMC in the data rate mode HS400, and wherein $T_{IH\text{-}HS400}$ represents a shortest input hold time of the eMMC in the data rate mode HS400.

17. The storage system of claim 10, wherein the first programmable input/output circuit and the second programmable input/output circuit are integrated in a same programmable logic device.

18. The storage system of claim 10, wherein the storage interface is distinct from the master controller.

19. An internal memory of a terminal, the internal memory comprising:
   a storage device;
   a master controller configured to output a clock signal and a data signal; and
   a storage interface coupled to the storage device and the master controller and comprising:
      a first programmable input/output circuit configured to:
         receive the clock signal from the master controller;
         perform a phase inversion on the clock signal to obtain a phase-inverted clock signal; and
         output the phase-inverted clock signal to the storage device; and
      a second programmable input/output circuit configured to:
         receive the data signal from the master controller;
         delay the data signal by a time difference ($\Delta T$) relative to the clock signal to obtain a delayed data signal; and
         output the delayed data signal to the storage device, wherein $T_{CLK}/2-\Delta T \geq T_{ISU}$ and $\Delta T \geq T_{IH}$, wherein $T_{CLK}$ represents a period of the phase-inverted clock signal, wherein $T_{ISU}$ represents a shortest input setup time of the storage device in each of different data rate modes, and wherein $T_{IH}$ represents a shortest input hold time of the storage device in each of the different data rate modes, and
   wherein the storage device is configured to:
      receive the phase-inverted clock signal from the first programmable input/output circuit;
      receive the delayed data signal from the second programmable input/output circuit; and
      sample the delayed data signal based on the phase-inverted clock signal.

20. The internal memory of claim 19, wherein the storage device comprises a storage medium and a device controller, and wherein the device controller is configured to perform a write operation on the storage medium based on the phase-inverted clock signal and the delayed data signal.

* * * * *